US009612289B2

(12) United States Patent
Novak et al.

(10) Patent No.: US 9,612,289 B2
(45) Date of Patent: Apr. 4, 2017

(54) DETECTION DIAGNOSTIC FOR COMMUNICATION LOSS BETWEEN A BATTERY SYSTEM MANAGER CONTROLLER AND A PLURALITY OF BATTERY CELL SENSING BOARDS

(71) Applicant: GM GLOBAL TECHNOLOGY OPERATIONS LLC, Detroit, MI (US)

(72) Inventors: Voytek A. Novak, Sterling Heights, MI (US); Vivekananda Shripathy, Farmington Hills, MI (US); Daniel P. Grenn, Highland, MI (US); Andrew C. Baughman, Northville, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 419 days.

(21) Appl. No.: 14/317,771

(22) Filed: Jun. 27, 2014

(65) Prior Publication Data

US 2015/0377975 A1 Dec. 31, 2015

(51) Int. Cl.
*H02J 7/00* (2006.01)
*G01R 31/36* (2006.01)
*H01M 10/42* (2006.01)
*G01R 35/00* (2006.01)
*H01M 10/48* (2006.01)

(52) U.S. Cl.
CPC ......... *G01R 31/3658* (2013.01); *G01R 35/00* (2013.01); *H01M 10/42* (2013.01); *H01M 10/4257* (2013.01); *H01M 10/482* (2013.01); *H02J 7/0021* (2013.01); *H02J 7/0026* (2013.01); *H02J 7/0029* (2013.01); *H01M 2010/4278* (2013.01)

(58) Field of Classification Search
CPC ... G01R 31/3658; G01R 35/00; H01M 10/42; H01M 10/4257; H01M 10/482; H01M 2010/4278; H02J 7/0021; H02J 7/0026; H02J 7/0029
USPC ......................................... 324/434
See application file for complete search history.

(56) References Cited

U.S. PATENT DOCUMENTS

| | | | |
|---|---|---|---|
| 2005/0084745 A1* | 4/2005 | Colello | H01M 8/04679 429/61 |
| 2012/0223678 A1* | 9/2012 | Yokoura | H01M 10/4207 320/128 |
| 2015/0171642 A1* | 6/2015 | Kato | H04Q 9/00 320/107 |
| 2015/0309121 A1* | 10/2015 | Butzmann | G01R 31/3658 324/434 |

* cited by examiner

*Primary Examiner* — Nathaniel Pelton
(74) *Attorney, Agent, or Firm* — Quinn IP Law

(57) ABSTRACT

A method of identifying a non-communicative battery Cell Sensing Board (CSB) within a plurality of battery CSBs arranged in a serial chain includes sequentially reconfiguring the serial chain of the battery CSBs to sequentially define each of the plurality of battery CSBs as a last battery CSB in a temporary test serial chain. Communication with the last battery CSB of each temporary test serial chain is sequentially established with a loopback feature of the battery CSBs. When a disruption in communication between the battery system manager controller and the last battery CSB of the current temporary test serial chain is detected, the last battery CSB of the current temporary test serial chain is identified as the non-communicative battery CSB.

18 Claims, 2 Drawing Sheets

DETECTION DIAGNOSTIC FOR COMMUNICATION LOSS BETWEEN A BATTERY SYSTEM MANAGER CONTROLLER AND A PLURALITY OF BATTERY CELL SENSING BOARDS

TECHNICAL FIELD

The invention generally relates to a method of identifying a non-communicative battery cell sensing board within a plurality of identically configured battery cell sensing boards arranged in a serial chain and connected to a battery system manager controller of a hybrid vehicle.

BACKGROUND

Hybrid vehicles often include an electric motor that is powered by a battery pack. The battery pack includes a plurality of individual battery cells or modules that are connected together. Each of the battery cells may include a battery Cell Sensing Board (CSB), which is connected to a respective battery cell, and senses information related to its respective battery cell. Accordingly, the hybrid vehicle will include a plurality of CSB's, with one of the CSB's associated with and/or connected to a respective one of the battery cells. Each of the CSB's is connected to a Battery System Manager (BSM) controller. The BSM controller communicates with and receives information from each of the CSB's, in order to control the operation of the battery pack.

The plurality of CSB's may be arranged in a serial chain with each other, often referred to as a "daisy chain", and are connected to the BSM controller through a Universal Asynchronous Receiver/Transmitter (UART) protocol. Because the CSB's are arranged in the serial chain, if one of the CSB's malfunctions, and is no longer capable of communicating with the BSM controller, then the BSM controller loses communication with all of the CSB's. This is because signals must route through each of the CSB's in turn, from the CSB disposed nearest to the BSM controller in the serial chain, out to the CSB disposed farthest from the BSM controller in the serial chain, and then back to the BSM controller. It is therefore important, when communication between the BSM controller and the CSB's is disrupted, to be able to identify which specific one of the CSB boards is not functioning properly and causing the communication disruption.

SUMMARY

A method of identifying a non-communicative battery cell sensing board within a plurality of identically configured battery cell sensing boards arranged in a serial chain and connected to a battery system manager controller is provided. The method includes detecting a disruption in communication between the battery system manager controller and the plurality of battery cell sensing boards. The serial chain of the plurality of battery cell sensing boards is sequentially reconfigured with the battery system manager controller, to sequentially define each of the plurality of battery cell sensing boards as a last battery cell sensing board in a temporary test serial chain. Communication with the last battery cell sensing board of each temporary test serial chain is sequentially established with a loopback feature of the battery cell sensing boards. A disruption in communication between the battery system manager controller and the last battery cell sensing board of a current temporary test serial chain is detected. When a disruption in communication between the battery system manager controller and the last battery cell sensing board of the current temporary test serial chain is detected, the last battery cell sensing board of the current temporary test serial chain is identified as the non-communicative battery cell sensing board.

Accordingly, when the battery system manager controller detects a disruption in communication with the battery cell sensing boards, the battery state manger controller initiates an individual battery cell sensing board diagnostic algorithm to identify the non-communicative, i.e., faulty, battery cell sensing board. The battery system manager controller sequentially redefines the serial chain to sequentially communicate with each of the battery cell sensing boards in turn. For example, the battery system manager controller defines a first battery cell sensing board, disposed nearest to the battery system manager controller, as the last battery cell sensing board in a first temporary test serial chain and communicates with it. If the battery system manager controller is not successful in communicating with the first battery cell sensing board, then the battery system manager controller may determine or identify the first battery cell sensing board is non-communicative, and is faulty. However, if the battery system manager controller is successful in communication with that first battery cell sensing board, then the battery system manager controller defines a second battery cell sensing board, disposed second nearest to the battery system manager controller, as the last cell sensing board in a second temporary test serial chain and communicates with it. If the battery system manager controller is not successful in communicating with the second battery cell sensing board, then the battery system manager controller may determine or identify the second battery cell sensing board is non-communicative, and is faulty. However, if the battery system manager controller is successful in communication with that second battery cell sensing board, then the battery system manager controller defines a third battery cell sensing board, disposed third nearest to the battery system manager controller, as the last cell sensing board in a third temporary test serial chain and communicates with it. This process continues in a sequential order until the battery system manager controller is able to identify the non-communicative battery cell sensing board. The above described process allows the battery system manager controller to identify a non-communicative battery cell sensing board, while allowing all of the battery cell sensing boards to be identically configured, without requiring each of the battery cell sensing boards to have separate and distinct identifiers associated with them.

The above features and advantages and other features and advantages of the present invention are readily apparent from the following detailed description of the best modes for carrying out the invention when taken in connection with the accompanying drawings.

DETAILED DESCRIPTION

Those having ordinary skill in the art will recognize that terms such as "above," "below," "upward," "downward," "top," "bottom," etc., are used descriptively for the figures, and do not represent limitations on the scope of the invention, as defined by the appended claims. Furthermore, the invention may be described herein in terms of functional and/or logical block components and/or various processing steps. It should be realized that such block components may be comprised of any number of hardware, software, and/or firmware components configured to perform the specified functions.

Figure 1:
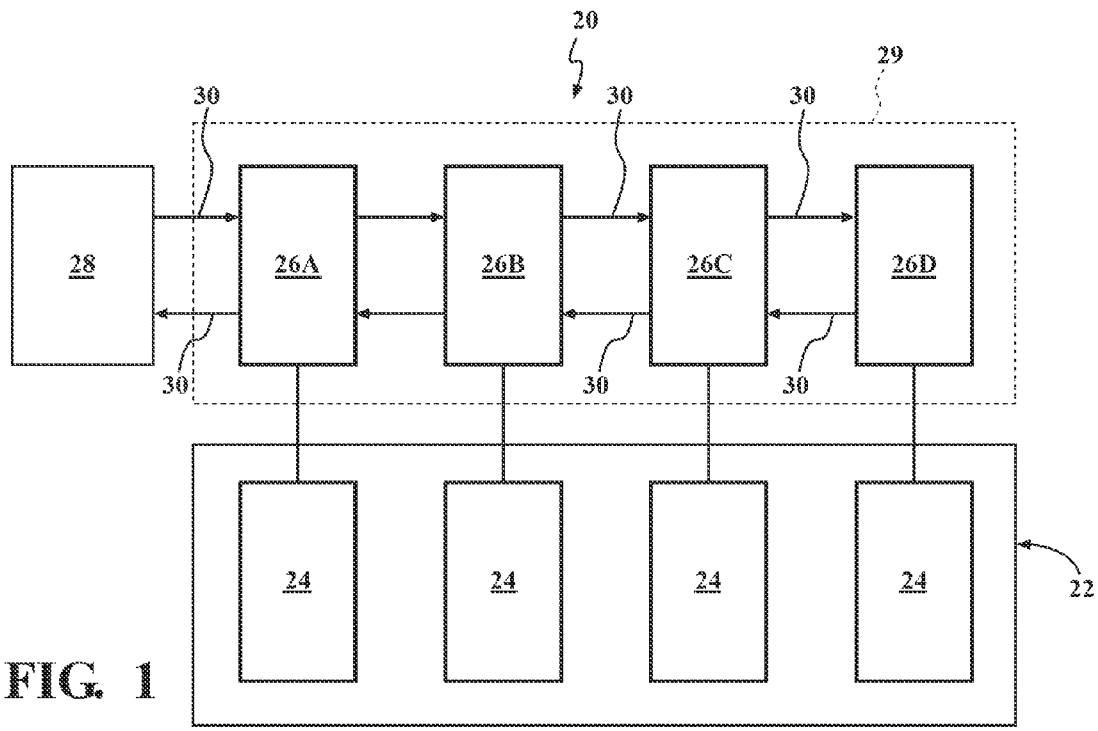
FIG. 1 is a schematic plan view of a battery system for a hybrid vehicle, showing a battery system manager controller communicating with a plurality of battery cell sensing boards arranged in a serial chain.

Referring to the Figures, wherein like numerals indicate like parts throughout the several views, a battery system for a hybrid vehicle is generally shown at 20. Referring to FIG. 1, the battery system 20 includes a battery pack 22 having a plurality of individual battery cells 24 or modules that are connected together. Each of the battery cells 24 may include a battery Cell Sensing Board (CSB) 26, which is connected to a respective battery cell 24, and senses information related to its respective battery cell 24. Accordingly, the hybrid vehicle will include a plurality of battery cell sensing boards 26, with one of the battery cell sensing boards 26 associated with and/or connected to a respective one of the battery cells 24. Each of the battery cell sensing boards 26 is connected to a Battery System Manager (BSM) controller 28. The BSM controller 28 communicates with and receives information from each of the battery cell sensing boards 26, in order to control the operation of the battery system 20.

The battery cell sensing boards 26 may include components and features that are intended to measure individual cell voltages, module voltages, and module temperatures from the battery pack 22. All cell voltages and module temperatures are reported directly to the BSM controller 28 on a regular periodic basis. The battery cell sensing boards 26 are also expected to perform internal circuit diagnostics and cell balancing at the command of the BSM controller 28.

The BSM controller 28 may include a computer or control module, capable of monitoring and controlling the operation of the battery system 20. The BSM controller 28 may include a computer and/or processor, and include all software, hardware, memory, algorithms, connections, sensors, etc., necessary to manage and control the operation of the battery system 20. As such, a method for identifying a non-communicative battery cell sensing board 44 may be embodied as a program operable on the BSM controller 28. It should be appreciated that the BSM controller 28 may include any device capable of analyzing data from various battery cell sensing boards 26, comparing data, making the necessary decisions required to control the operation of the battery system 20, and executing the required tasks necessary to control the operation of the battery system 20 and identify a non-communicative battery cell sensing board 44.

The plurality of battery cell sensing boards 26 are arranged in a serial chain 29 with each other, often referred to as a "daisy chain", and are connected to the BSM controller 28 through a Universal Asynchronous Receiver/Transmitter (UART) protocol. The serial chain of the battery cell sensing boards is generally outlined by the box 29, shown in FIG. 1. Because the battery cell sensing boards 26 are arranged in the serial chain 29, if one of the battery cell sensing boards 26 malfunctions, and is no longer capable of communicating with the BSM controller 28, then the BSM controller 28 loses communication with all of the battery cell sensing boards 26. This is because signals must route through each of the battery cell sensing boards 26 in turn, from the battery cell sensing board disposed nearest to the BSM controller 28 in the serial chain 29, out to the battery cell sensing board disposed farthest from the BSM controller 28 in the serial chain 29, and then back to the BSM controller 28. The general routing of a signal 30 through the serial chain 29 of battery cell sensing boards 26, when all battery cell sensing boards 26 are operating properly, is shown in FIG. 1. Within FIG. 1, the signal 30 is shown using solid line arrows, indicating successful communication between the respective battery cell sensing boards 26 and the BSM controller 28. However, if one of the battery cell sensing boards 26 becomes non-communicative, then the routing of the signal 30 is broken, and communication between the serial chain 29 of the battery cell sensing boards 26 and the BSM controller 28 is disrupted.

As noted above, the BSM controller 28 may include a program or algorithm that is operable to diagnoses a communication disruption between the BSM controller 28 and the plurality of battery cell sensing boards 26. More specifically, the method may identify a specific non-communicative battery cell sensing board 44 within the plurality of identically configured battery cell sensing boards 26.

The battery system 20 may include any number of battery packs 22, and as such, may include a corresponding number of battery cell sensing boards 26. "n" represents the total number of battery cell sensing boards 26 in the serial chain 29. As shown, the battery system 20 includes a first battery cell sensing board 26A disposed nearest the BSM controller 28 within the serial chain 29 of battery cell sensing boards 26, a second battery cell sensing board 26B disposed second nearest the BSM controller 28 within the serial chain 29 of battery cell sensing boards 26, a third battery cell sensing board 26C disposed third nearest the BSM controller 28 within the serial chain 29 of battery cell sensing boards 26, and an $n^{th}$ battery cell sensing board 26D disposed $n^{th}$ nearest the BSM controller 28 within the serial chain 29 of battery cell sensing boards 26. The battery cell sensing boards 26 are generally referred to in the written specification by the reference number 26, and are individually referred to and shown in the drawings by the respective reference numerals 26A, 26B, 26C, 26D.

The method includes detecting a disruption in communication between the BSM controller 28 and the plurality of battery cell sensing boards 26. The BSM controller 28 monitors communication with the serial chain 29 of the battery cell sensing boards 26, and upon detecting a disruption in communication, initiates an individual battery cell sensing board diagnostic algorithm to identify the non-communicative battery cell sensing board 44.

The diagnostic algorithm sequentially reconfigures the serial chain 29 of the plurality of battery cell sensing boards 26 to sequentially define each of the plurality of battery cell sensing boards 26 as a last battery cell sensing board in a temporary test serial chain, and sequentially attempt to establish communication with the last battery cell sensing board of each temporary test serial chain with a loopback feature of the battery cell sensing boards 26. This sequential process continues until the BSM controller 28 detects a disruption in communication between the BSM controller 28 and the last battery cell sensing board of a current temporary test serial chain. The current temporary test serial chain is the current temporary test serial chain that the BSM controller 28 is currently establishing communications with for diagnostic purposes, as described in greater detail below.

The loopback feature is a feature of each of the battery cell sensing boards 26 that allows the routing of the electronic signal 30, between each respective battery cell sensing board 26 and the BSM controller 28 without intentional processing or modification, as a means of testing the transmission and/or communication between the BSM controller 28 and the respective battery cell sensing boards 26. Establishing communication with the last battery cell sensing board of each temporary test serial chain includes routing the signal 30 through each temporary test serial chain, to the last battery cell sensing board of the respective temporary test serial chain, and back to the BSM controller 28 to confirm communication with all of the battery cell sensing boards 26 in the respective temporary test serial chain.

The serial chain 29 is sequentially reconfigured in a sequential order moving from nearest to the BSM controller 28 to farthest from the BSM controller 28. Accordingly, referring to FIG. 2, the diagnostic algorithm begins by reconfiguring the serial chain so that the first battery cell sensing board 26A, disposed nearest the BSM controller 28, within the serial chain 29 of the battery cell sensing boards 26, is defined as a last battery cell sensing board 32 in a first temporary test serial chain 34. Within FIG. 2, the first temporary test serial chain 34 is shown outlined by the box 34.

Once the BSM controller 28 has defined the first temporary test serial chain 34, the BSM controller 28 attempts to establish communication with the first battery cell sensing board 26A, i.e., the last battery cell sensing board 32 of the first temporary test serial chain 34. Because the first battery cell sensing board 26A is defined as the last battery cell sensing board 32 in the first temporary test serial chain 34, the only battery cell sensing board 26 that the BSM controller 28 must establish communication with or through at this point is the first battery cell sensing board 26A. If the BSM controller 28 detects a disruption in communication with the first battery cell sensing board 26A, then the BSM controller 28 may determine that the first battery cell sensing board 26A is the non-communicative battery cell sensing board 44. However, if the battery system manager is able to properly establish communication with the first battery cell sensing board 26A, then the BSM controller 28 may determine that the first battery cell sensing board 26A is operating properly, and is not the non-communicative battery cell sensing board 44.

Figure 2:
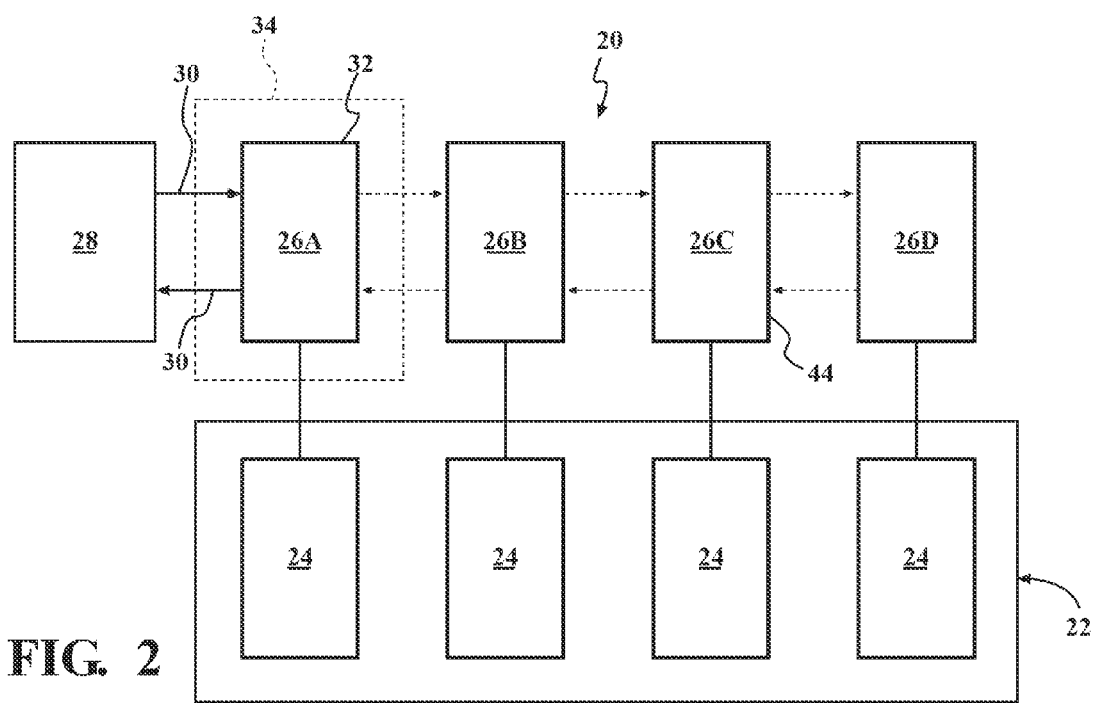
FIG. 2 is a schematic plan view of the battery system, showing the battery system manager controller communicating with a first battery cell sensing board of the serial chain.

As shown in FIG. 2, the non-communicative battery cell sensing board 44 is shown as the third battery cell sensing board 26C. The signal 30 is shown as a solid line arrow between the first battery cell sensing board 26A and the BSM controller 28 indicating successful communication therebetween. Because the first battery cell sensing board 26A is defined as the last battery cell sensing board 32 of the first temporary test serial chain 34, no communication is attempted with or between the first battery cell sensing board 26A, the second battery cell sensing board 26B, the third battery cell sensing board 26C, and the nth battery cell sensing board 26D. Within the Figures, a lack or failure of communication signal 30 is generally indicated by dashed arrows. Because the signal 30 was not routed through the non-communicative battery cell sensing board 44, the signal 30 was not disrupted, and was able to be returned to the BSM controller 28, thereby indicating proper functionality of the first battery cell sensing board 26A.

Figure 3:
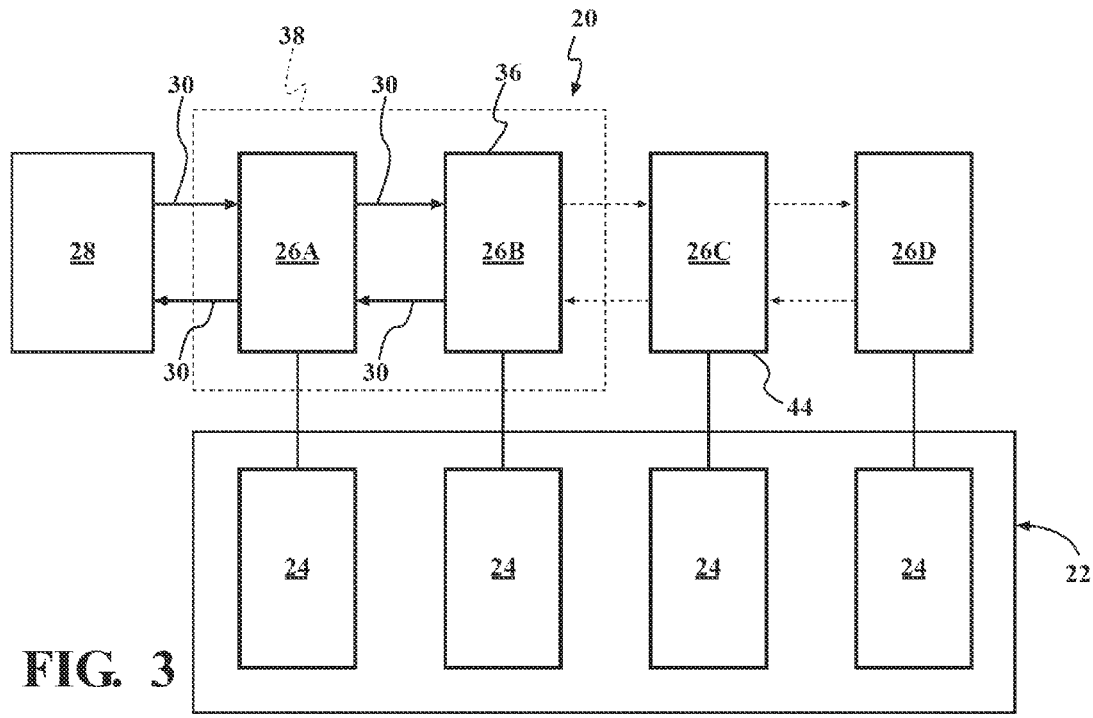
FIG. 3 is a schematic plan view of the battery system, showing the battery system manager controller communicating with a second battery cell sensing board of the serial chain.

Referring to FIG. 3, if the BSM controller 28 is able to establish communication with the first battery cell sensing board 26A, thereby determining that the first battery cell sensing board 26A is not the non-communicative battery cell sensing board 44, then the BSM controller 28 may reconfigure the serial chain 29 so that the second battery cell sensing board 26B, disposed second nearest the BSM controller 28, within the serial chain 29 of the battery cell sensing boards 26, is defined as a last battery cell sensing board 36 in a second temporary test serial chain 38. Within FIG. 3, the second temporary test serial chain 38 is shown outlined by the box 38.

Once the BSM controller 28 has defined the second temporary test serial chain 38, the BSM controller 28 attempts to establish communication with the second battery cell sensing board 26B, i.e., the last battery cell sensing board 36 of the second temporary test serial chain 38. Because the second battery cell sensing board 26B is defined as the last battery cell sensing board 36 in the second temporary test serial chain 38, the BSM controller 28 must establish communication with the second battery cell sensing board 26B through the first battery cell sensing board 26A. However, as noted above, the BSM controller 28 has already determined that the first battery cell sensing board 26A is communicative, and operating properly. If the BSM controller 28 detects a disruption in communication with the second temporary test serial chain 38, then the BSM controller 28 may determine that the second battery cell sensing board 26B is the non-communicative battery cell sensing board 44. However, if the battery system manager is able to properly establish communication with the second temporary test serial chain 38, then the BSM controller 28 may determine that the second battery cell sensing board 26B is operating properly, and is not the non-communicative battery cell sensing board 44.

As shown in FIG. 3, the non-communicative battery cell sensing board 44 is shown as the third battery cell sensing board 26C. The signal 30 is shown as a solid line arrow between the BSM controller 28, the first battery cell sensing board 26A, and the second battery cell sensing board 26B, indicating successful communication therebetween. Because the second battery cell sensing board 26B is defined as the last battery cell sensing board 36 of the second temporary test serial chain 38, no communication is attempted with or between the second battery cell sensing board 26B, the third battery cell sensing board 26C, and the nth battery cell sensing board 26D. As noted above, a lack or failure of communication signal 30 is generally indicated by dashed arrows. Because the signal 30 was not routed through the non-communicative battery cell sensing board 44, the signal 30 was not disrupted, and was able to be returned to the BSM controller 28, thereby indicating proper functionality of the second battery cell sensing board 26B.

Figure 4:
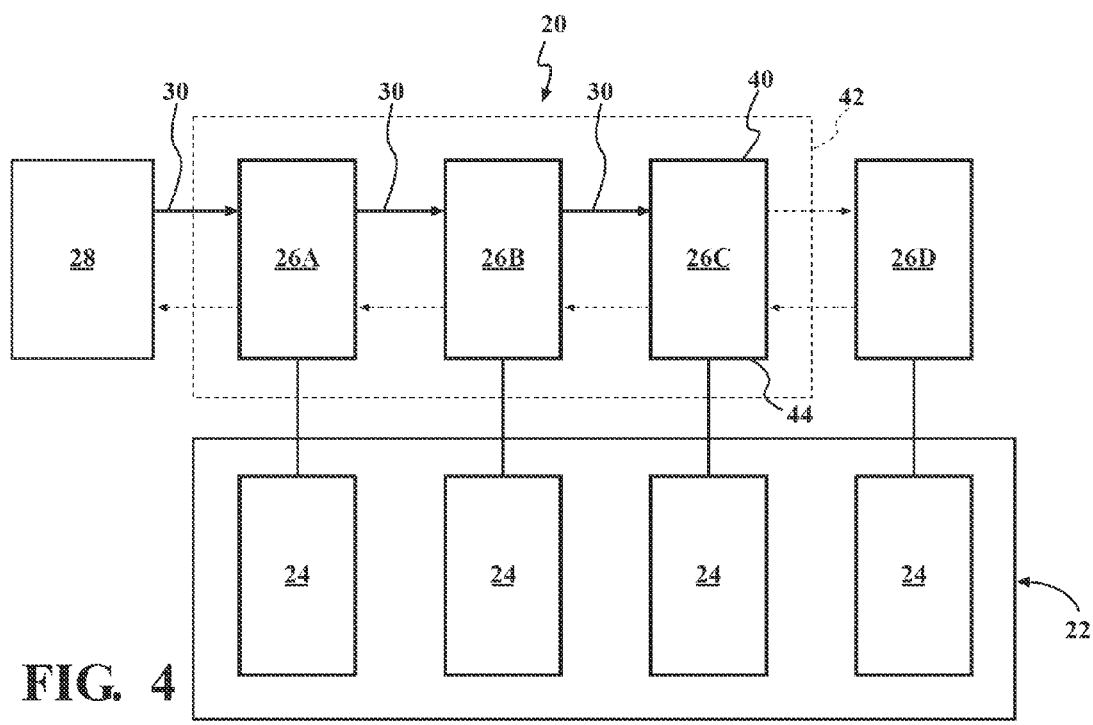
FIG. 4 is a schematic plan view of the battery system, showing the battery system manager controller communicating with an $n^{th}$ battery cell sensing board of the serial chain.

Referring to FIG. 4, if the BSM controller 28 is able to establish communication with the second battery cell sensing board 26B, thereby determining that the second battery cell sensing board 26B is not the non-communicative battery cell sensing board 44, then the batter state manager controller may reconfigure the serial chain 29 so that the third battery cell sensing board 26C, disposed third nearest the BSM controller 28, within the serial chain 29 of the battery cell sensing boards 26, is defined as a last battery cell sensing board 40 in a third temporary test serial chain 42. Within FIG. 4, the third temporary test serial chain 42 is shown outlined by the box 42.

Once the BSM controller 28 has defined the third temporary test serial chain 42, the BSM controller 28 attempts to establish communication with the third battery cell sensing board 26C, i.e., the last battery cell sensing board 40 of the third temporary test serial chain 42. Because the third battery cell sensing board 26C is defined as the last battery cell sensing board 40 in the third temporary test serial chain 42, the BSM controller 28 must establish communication with the third battery cell sensing board 26C through the first battery cell sensing board 26A and the second battery cell sensing board 26B. However, as noted above, the BSM controller 28 has already determined that the first battery cell sensing board 26A and the second cell sensing board 26B are communicative, and operating properly. If the BSM controller 28 detects a disruption in communication with the third temporary test serial chain 42, then the BSM controller 28 may determine that the third battery cell sensing board 26C is the non-communicative battery cell sensing board 44. However, if the battery system manager is able to properly establish communication with the third temporary test serial chain 42, then the BSM controller 28 may determine that the third battery cell sensing board 26C is operating properly, and is not the non-communicative battery cell sensing board 44.

As shown in FIG. 4, the non-communicative battery cell sensing board 44 is shown as the third battery cell sensing board 26C. The signal 30 is shown as a solid line arrow between the BSM controller 28, the first battery cell sensing board 26A, the second battery cell sensing board 26B, and the third battery cell sensing board 26C indicating successful communication from the BSM controller 28 to the third battery cell sensing board 26C. However, because the third battery cell sensing board is defined in this example as the non-communicative battery cell sensing board 44, communication from the third battery cell sensing board 26C back to the BSM controller 28 is disrupted, which is indicated by the dashed communication arrows. Because the third battery cell sensing board 26C is defined as the last battery cell sensing board 40 of the third temporary test serial chain 42, no communication is attempted with or between the third battery cell sensing board 26C, and the nth battery cell sensing board 26D. As noted above, a lack or failure of communication signal 30 is generally indicated by dashed arrows. Because the signal 30 was routed through the non-communicative battery cell sensing board 44, the signal 30 was disrupted, and was not able to be returned to the BSM controller 28, thereby indicating improper functionality of the third battery cell sensing board 26C, and identifying the third battery cell sensing board 26C as the non-communicative battery cell sensing board 44.

This process may be continued sequentially as described above for all of the battery cell sensing boards 26, until the BSM controller 28 identifies the non-communicative battery cell sensing board 44. Accordingly, if the non-communicative cell sensing board is the last cell sensing board in the serial chain 29, i.e., the $n^{th}$ cell sensing board, then it should be appreciated that this process may continue until the BSM controller 28 defines the $n^{th}$ battery cell sensing board 26D, disposed $n^{th}$ nearest the BSM controller 28, within the serial chain 29 of the battery cell sensing boards 26, as the last battery cell sensing board in an $n^{th}$ temporary test serial chain. However, if the BSM controller 28 identifies the non-communicative battery cell sensing board 44 prior to diagnosing all of the cell sensing boards 26, then the BSM controller 28 may stop the sequential reconfiguration and diagnostic testing. For example, referring to FIG. 4, if the third cell sensing board 26C is determined to be the non-communicative cell sensing board, generally indicated by the reference numeral 44, based on the failure of the BSM controller 28 to route the signal 30 through the loopback of the third cell sensing board 26C, then the BSM controller 28 does not need to continue testing the remaining cell sensing boards 26.

As noted above, when a disruption in communication between the BSM controller 28 and the last battery cell sensing board of the current temporary test serial chain is detected, the BSM controller 28 may identify the last battery cell sensing board of the current temporary test serial chain as the non-communicative battery cell sensing board 44. This is because of the previous battery cell sensing boards have already been tested and determined to be communicative, i.e., operating properly, by establishing communications with each of the different temporary test serial chains in the sequential order of the cell sensing boards relative to the BSM controller 28.

Once the BSM controller 28 has identified which specific battery cell sensing board is the non-communicative battery cell sensing board 44, via the process described above, then the BSM controller 28 may provide a signal indicating which of the plurality of battery cell sensing boards 26 is identified as the non-communicative battery cell sensing board 44. The signal may include a warning light, a coded message, or any other suitable signal capable of alerting an operator and providing the necessary information to identify the non-communicative battery cell sensing board 44.

The detailed description and the drawings or figures are supportive and descriptive of the invention, but the scope of the invention is defined solely by the claims. While some of the best modes and other embodiments for carrying out the claimed invention have been described in detail, various alternative designs and embodiments exist for practicing the invention defined in the appended claims.

The invention claimed is:

1. A method of identifying a non-communicative battery cell sensing board within a plurality of identically configured battery cell sensing boards arranged in a serial chain and connected to a battery system manager controller, the method comprising:
    detecting a disruption in communication between the battery system manager controller and the plurality of battery cell sensing boards;
    sequentially reconfiguring the serial chain of the plurality of battery cell sensing boards with the battery system manager controller to sequentially define each of the plurality of battery cell sensing boards as a last battery cell sensing board in a temporary test serial chain;
    sequentially establishing communication with the last battery cell sensing board of each temporary test serial chain with a loopback feature of the battery cell sensing boards;
    detecting a disruption in communication between the battery system manager controller and the last battery cell sensing board of a current temporary test serial chain; and
    identifying the last battery cell sensing board of the current temporary test serial chain as the non-communicative battery cell sensing board when a disruption in communication between the battery system manager controller and the last battery cell sensing board of the current temporary test serial chain is detected.

2. A method as set forth in claim 1 wherein sequentially reconfiguring the serial chain of the plurality of battery cell sensing boards includes sequentially defining the last battery cell sensing board in the temporary test serial chain in a sequential order moving from nearest to the battery system manager controller to farthest from the battery system manager controller.

3. A method as set forth in claim 2 wherein sequentially establishing communication with the last battery cell sensing board of each temporary test serial chain includes routing a signal through each temporary test serial chain, to the last battery cell sensing board of the respective temporary test serial chain, and back to the battery system manager controller to confirm communication with all of the battery cell sensing boards in the respective temporary test serial chain.

4. A method as set forth in claim 1 wherein sequentially reconfiguring the serial chain of the plurality of battery cell sensing boards to sequentially define each of the plurality of battery cell sensing boards as the last battery cell sensing board in a temporary test serial chain includes defining a first temporary test serial chain in which the battery cell sensing board disposed within the serial chain of battery cell sensing boards, nearest the battery system manager controller, is defined as the last battery cell sensing board of the first temporary test serial chain.

5. The method as set forth in claim 4 wherein sequentially establishing communication with the last battery cell sensing board of each temporary test serial chain includes establishing communication with the last battery cell sensing board of the first temporary test serial chain.

6. The method as set forth in claim 5 wherein identifying the last battery cell sensing board of the current temporary test serial chain as the non-communicative battery cell sensing board when a disruption in communication between the battery system manager controller and the last battery cell sensing board of the current temporary test serial chain is detected includes identifying the last battery cell sensing board of the first temporary test serial chain as the non-communicative battery cell sensing board when a disruption in communication between the battery system manager controller and the last battery cell sensing board of the first temporary test serial chain is detected.

7. The method as set forth in claim 6 wherein sequentially reconfiguring the serial chain of the plurality of battery cell sensing boards to sequentially define each of the plurality of battery cell sensing boards as the last battery cell sensing board in a temporary test serial chain includes defining a second temporary test serial chain in which the battery cell sensing board disposed within the serial chain of battery cell sensing boards, second nearest the battery system manager controller, is defined as the last battery cell sensing board of the second temporary test serial chain, when no disruption in communication between the battery system manager controller and the last battery cell sensing board of the first temporary test serial chain occurs.

8. The method as set forth in claim 7 wherein:
sequentially establishing communication with the last battery cell sensing board of each temporary test serial chain includes establishing communication with the last battery cell sensing board of the second temporary test serial chain;
identifying the last battery cell sensing board of the current temporary test serial chain as the non-communicative battery cell sensing board when a disruption in communication between the battery system manager controller and the last battery cell sensing board of the current temporary test serial chain is detected includes identifying the last battery cell sensing board of the second temporary test serial chain as the non-communicative battery cell sensing board when a disruption in communication between the battery system manager controller and the last battery cell sensing board of the second temporary test serial chain is detected; and wherein
sequentially reconfiguring the serial chain of the plurality of battery cell sensing boards to sequentially define each of the plurality of battery cell sensing boards as the last battery cell sensing board in a temporary test serial chain includes defining a third temporary test serial chain in which the battery cell sensing board disposed within the serial chain of battery cell sensing boards, third nearest the battery system manager controller, is defined as the last battery cell sensing board of the third temporary test serial chain, when no disruption in communication between the battery system manager controller and the last battery cell sensing board of the second temporary test serial chain occurs.

9. A method as set forth in claim 1 further comprising signaling which of the plurality of battery cell sensing boards is identified as the non-communicative battery cell sensing board.

10. A method as set forth in claim 1 further comprising initiating an individual battery cell sensing board diagnostic algorithm with the battery system manager controller to identify the non-communicative battery cell sensing board when a disruption in communication between the battery system manager controller and the plurality of battery cell sensing boards is detected.

11. A method of diagnosing a communication disruption between a battery system manager controller and a plurality of battery cell sensing boards arranged in a serial chain and connected to the battery system manager controller through a Universal Asynchronous Receiver/Transmitter (UART) protocol, the method comprising:
defining a first temporary test serial chain, with the battery system manager controller, in which the battery cell sensing board disposed within the serial chain of battery cell sensing boards nearest the battery system manager controller is defined as the last battery cell sensing board of the first temporary test serial chain;
attempting to establish communication with the last battery cell sensing board of the first temporary test serial chain, with the battery system manager controller; and
identifying the last battery cell sensing board of the first temporary test serial chain as a non-communicative battery cell sensing board when a disruption in communication between the battery system manager controller and the last battery cell sensing board of the first temporary test serial chain is detected;
defining a second temporary test serial chain, with the battery system manger controller, in which the battery cell sensing board disposed within the serial chain of battery cell sensing boards, second nearest the battery system manager controller, is defined as the last battery cell sensing board of the second temporary test serial chain, when no disruption in communication between the battery system manager controller and the last battery cell sensing board of the first temporary test serial chain occurs.

12. A method as set forth in claim 11 further comprising signaling which of the plurality of battery cell sensing boards is identified as the non-communicative battery cell sensing board.

13. A method as set forth in claim 11 further comprising attempting to establish communication with the last battery cell sensing board of the second temporary test serial chain.

14. A method as set forth in claim 13 further comprising identifying the last battery cell sensing board of the second temporary test serial chain as a non-communicative battery cell sensing board when a disruption in communication between the battery system manager controller and the last battery cell sensing board of the second temporary test serial chain is detected.

15. A method as set forth in claim 14 further comprising defining a third temporary test serial chain in which the battery cell sensing board disposed within the serial chain of battery cell sensing boards, third nearest the battery system manager controller, is defined as the last battery cell sensing board of the third temporary test serial chain, when no disruption in communication between the battery system manager controller and the last battery cell sensing board of the second temporary test serial chain occurs.

16. A method of identifying a non-communicative battery cell sensing board within a plurality of identically configured battery cell sensing boards arranged in a serial chain and connected to a battery system manager controller, wherein n represents the total number of battery cell sensing boards in the serial chain, the method comprising:
   detecting a disruption in communication between the battery system manager controller and the plurality of battery cell sensing boards;
   sequentially reconfiguring the serial chain of the plurality of battery cell sensing boards with the battery system manager controller to sequentially define each of the plurality of battery cell sensing boards as a last battery cell sensing board in a temporary test serial chain, wherein a first battery cell sensing board disposed nearest the battery system manager controller within the serial chain of the battery cell sensing boards is defined as the last battery cell sensing board in a first temporary test serial chain, a second battery cell sensing board disposed second nearest the battery system manager controller within the serial chain of the battery cell sensing boards is defined as the last battery cell sensing board in a second temporary test serial chain, . . . and a $n^{th}$ battery cell sensing board disposed $n^{th}$ nearest the battery system manager controller within the serial chain of the battery cell sensing boards is defined as the last battery cell sensing board in an $n^{th}$ temporary test serial chain;
   sequentially establishing communication with the last battery cell sensing board of each temporary test serial chain with a loopback feature of the battery cell sensing boards;
   detecting a disruption in communication between the battery system manager controller and the last battery cell sensing board of a current temporary test serial chain with the battery system manager controller, wherein the current temporary test serial chain is the one of the first temporary test serial chain, the second temporary test serial chain, . . . , or the nth temporary test serial chain that the battery system manager controller is currently establishing communications with; and
   identifying the last battery cell sensing board of the current temporary test serial chain as the non-communicative battery cell sensing board when a disruption in communication between the battery system manager controller and the last battery cell sensing board of the current temporary test serial chain is detected.

17. A method as set forth in claim 16 further comprising signaling which of the plurality of battery cell sensing boards is identified as the non-communicative battery cell sensing board.

18. A method as set forth in claim 16 further comprising initiating an individual battery cell sensing board diagnostic algorithm with the battery system manager controller to identify the non-communicative battery cell sensing board when a disruption in communication between the battery system manager controller and the plurality of battery cell sensing boards is detected.

* * * * *